United States Patent
Stoeferle et al.

(10) Patent No.: US 11,251,355 B2
(45) Date of Patent: Feb. 15, 2022

(54) RESONANCE FREQUENCY ADJUSTMENT FOR FIXED-FREQUENCY QUBITS

(71) Applicant: International Business Machines Corporation, Armonk, NY (US)

(72) Inventors: Thilo Hermann Curt Stoeferle, Rueschlikon (CH); Andreas Fuhrer Janett, Zurich (CH); Stefan Filipp, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 280 days.

(21) Appl. No.: 16/292,643

(22) Filed: Mar. 5, 2019

(65) Prior Publication Data

US 2020/0287121 A1    Sep. 10, 2020

(51) Int. Cl.
| | | |
|---|---|---|
| *H01L 39/24* | (2006.01) | |
| *H01P 11/00* | (2006.01) | |
| *H01P 7/00* | (2006.01) | |
| *H03H 3/013* | (2006.01) | |
| *H01L 39/12* | (2006.01) | |

(Continued)

(52) U.S. Cl.
CPC ........ *H01L 39/2406* (2013.01); *H01L 39/249* (2013.01); *H01P 7/00* (2013.01); *H01P 11/008* (2013.01); *H03H 3/013* (2013.01); *H01L 39/12* (2013.01); *H01L 39/223* (2013.01); *H03H 3/02* (2013.01)

(58) Field of Classification Search
CPC ... H01L 39/2406; H01L 39/249; H01L 39/12; H01L 39/223; H03H 3/013; H03H 3/02; H01P 11/008; H01P 7/00; H01P 7/08
See application file for complete search history.

(56) References Cited

U.S. PATENT DOCUMENTS

| | | |
|---|---|---|
| 6,347,237 B1 | 2/2002 | Eden et al. |
| 6,903,402 B2 | 6/2005 | Miyazawa |
| 7,369,010 B2 | 5/2008 | Alvarez et al. |

(Continued)

FOREIGN PATENT DOCUMENTS

WO    2005053086 A2    6/2005

OTHER PUBLICATIONS

AVX RF, The Precision Laser Trimmed Capacitor (PLTC) series, Aug. 8, 2018.

(Continued)

*Primary Examiner* — Matthew L Reames
(74) *Attorney, Agent, or Firm* — Garg Law Firm, PLLC; Rakesh Garg; Douglas Pearson

(57) ABSTRACT

A method of an embodiment includes forming a capacitor pad for a nonlinear resonator. In an embodiment, the method includes comparing a resonance frequency of the nonlinear resonator to a target frequency to determine whether the resonance frequency falls within a range of the target frequency. A device of an embodiment includes a first capacitor pad comprising a superconducting material, the first capacitor pad configured to couple to a first end of a logic circuit element. In an embodiment, the device includes a second capacitor pad comprising a second superconducting material, the capacitor pad configured to couple to a second end of the logic circuit element. In an embodiment, the second capacitor pad includes a first portion; a second portion; and a bridge configured to electrically connect the first portion and the second portion.

9 Claims, 9 Drawing Sheets

(51) Int. Cl.
  *H01L 39/22* (2006.01)
  *H03H 3/02* (2006.01)

(56) References Cited

U.S. PATENT DOCUMENTS

| | | |
|---|---|---|
| 9,501,748 B2 | 11/2016 | Naaman et al. |
| 9,818,796 B2 | 11/2017 | Abraham et al. |
| 9,893,262 B2 | 2/2018 | Thompson et al. |
| 2017/0072504 A1 | 3/2017 | Abraham et al. |
| 2017/0077382 A1 | 3/2017 | Abraham et al. |
| 2017/0193388 A1 | 7/2017 | Filipp et al. |
| 2017/0317262 A1 | 11/2017 | Abraham et al. |
| 2018/0240035 A1 | 8/2018 | Scheer et al. |
| 2018/0247974 A1 | 8/2018 | Oliver et al. |

OTHER PUBLICATIONS

Stanis Courreges, Tuning of Superconducting Filters With laser Ablation Technique, Oct. 5, 2009.
International Searching Authority, PCT/IB2020/051458, dated Jun. 4, 2020.

*FIGURE 1 (PRIOR-ART)*

RESONANCE FREQUENCY ADJUSTMENT FOR FIXED-FREQUENCY QUBITS

TECHNICAL FIELD

The present invention relates generally to a superconductor device, a fabrication method, and fabrication system for superconducting qubit resonators. More particularly, the present invention relates to a device, method, and system for resonance frequency adjustment for fixed-frequency qubits.

BACKGROUND

Hereinafter, a "Q" or "q" prefix in a word or phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits) to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor (IBM is a registered trademark of International Business Machines corporation in the United States and in other countries.)

A superconducting qubit may include a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature-pairs of electrons can tunnel from one superconducting layer through the non-superconducting layer to the other superconducting layer. In a superconducting qubit, the Josephson junction—which has an inductance—is electrically coupled in parallel with one or more capacitive devices forming a nonlinear resonator.

In a superconducting state, the material firstly offers no resistance to the passage of electrical current. When resistance falls to zero, a current can circulate inside the material without any dissipation of energy. Secondly, the material exhibits Meissner effect, i.e., provided they are sufficiently weak, external magnetic fields do not penetrate the superconductor, but remain at its surface. When one or both of these properties are no longer exhibited by the material, the material is said to be no longer superconducting.

A critical temperature of a superconducting material is a temperature at which the material begins to exhibit characteristics of superconductivity. Superconducting materials exhibit very low or zero resistivity to the flow of current. A critical field is the highest magnetic field, for a given temperature, under which a material remains superconducting.

Superconductors are generally classified into one of two types. Type I superconductors exhibit a single transition at the critical field. Type I superconductors transition from a non-superconducting state to a superconducting state when the critical field is reached. Type II superconductors include two critical fields and two transitions. At or below the lower critical field, type II superconductors exhibit a superconducting state. Above the upper critical field, type II superconductors exhibit no properties of superconductivity. Between the upper critical field and the lower critical field, type II superconductors exhibit a mixed state. In a mixed state, type II superconductors exhibit an incomplete Meissner effect, i.e., penetration of external magnetic fields in quantized packets at specific locations through the superconductor material.

The Meissner effect results from the generation of persistent currents at the surface of the superconductor material. Persistent currents are perpetual electric currents which do not require an external power source. The persistent currents generate an opposing magnetic field to cancel the external magnetic field throughout the bulk of the superconductor material. In a superconducting state, persistent currents do not decay with time due to the zero resistance property.

The information processed by qubits is emitted in the form of microwave energy in a range of microwave frequencies. The microwave emissions are captured, processed, and analyzed to decipher the quantum information encoded therein. For quantum computing of qubits to be reliable, quantum circuits, e.g., the qubits themselves, the readout circuitry associated with the qubits, and other types of superconducting quantum logic circuits, must not alter the energy states of the particles or the microwave emissions in any significant manner. This operational constraint on any circuit that operates with quantum information necessitates special considerations in fabricating semiconductor and/or superconductor structures that are used in such a circuit.

The readout circuitry is generally coupled with a qubit by electromagnetic resonance (usually a microwave or radio-frequency resonance) using a resonator. A resonator in the readout circuitry comprises inductive and capacitive elements. Some qubits are fixed-frequency qubits, i.e., their resonance frequencies are not changeable. Other qubits are frequency-tunable qubits. A q-processor can employ fixed-frequency qubits, frequency-tunable qubits, or a combination thereof.

The illustrative embodiments recognize that a fixed-frequency qubit is designed to be fixed in frequency to improve immunity to noise. The illustrative embodiments recognize that when the resonance frequencies of two neighboring qubits on a chip are the same or within a threshold band of frequencies, or their higher transition frequencies are on resonance or close to resonance, then negative effects can happen such as, crosstalk, quantum decoherence, energy decay, creation of mixed states, unintended information transfer, quantum state leakage and so on. The illustrative embodiments further recognize that such qubits can also negatively affect the performance or utility of certain quantum gates, such as cross-resonance gates which have stringent requirements on the spectrum of resonance frequencies of qubits upon which the gate is operating on. The illustrative embodiments further recognize that one challenge in quantum processors that are based on fixed-frequency qubits is frequency crowding or frequency collision between adjacent qubits.

The illustrative embodiments recognize that another challenge in quantum processors that are based on fixed-frequency qubits is low On/Off ratios between when microwave signals turn On an interaction (On interaction strength) and the interactions between neighboring qubits when these signals are disabled (Off interaction strength). The illustrative embodiments further recognize that yet another challenge in quantum processors that are based on fixed-frequency qubits is enabling a gate of interest without producing unwanted interactions at other gates. The illustrative embodiments further recognize that imperfections in the fabrication and the materials used in the presently available fabrication methods for fixed-frequency qubits leads to deviations from an intended resonance frequency.

FIG. 1 depicts a scaled image of a qubit with a capacitive coupling to external circuits. Image 100 shows a portion of a qubit chip. Coupling capacitors 102 couple with transmission lines (not visible) that bring the electromagnetic signal out from Josephson junction 104. Capacitor pads 106 are capacitive devices driving Josephson junction 104 and forming a nonlinear resonator. A ground-plane (not visible) typically surrounds all or a portion of this structure.

The illustrative embodiments recognize that a qubit's resonance frequency is inherently fixed at the time the qubit is fabricated, i.e., when the Josephson Junction and the capacitive element of the qubit-oscillator are fabricated on a q-processor chip. The illustrative embodiments further recognize that in the simplest implementation of a q-processor, at least two qubits are needed to implement a quantum logic gate. Therefore, a q-processor chip is typically fabricated to have at least 2, but often 8, 16, or more qubits on a single q-processor chip.

SUMMARY

The illustrative embodiments provide a superconducting device, and a method and system of fabrication therefor. A method of an embodiment includes forming a capacitor pad for a nonlinear resonator. In an embodiment, the method includes comparing a resonance frequency of the nonlinear resonator to a target frequency to determine whether the resonance frequency falls within a range of the target frequency.

In an embodiment, the method includes removing, responsive to the resonance frequency failing to fall within the range, a portion of the capacitor pad. In an embodiment, the method includes removing a segment of a second capacitor pad to form a bridge, the bridge electrically coupling a first portion of the second capacitor pad and a second portion of the capacitor pad.

In an embodiment, the portion comprises the bridge. In an embodiment, the segment is removed by masking and etching the second capacitor pad. In an embodiment, the method includes removing a plurality of segments of a second capacitor pad to form a plurality of bridges.

In an embodiment, the portion comprises the plurality of bridges. In an embodiment, the plurality of segments are removed by masking and etching the second capacitor pad. In an embodiment, the method includes removing, responsive to the resonance frequency failing to fall within the acceptable range, a second portion of a second capacitor pad. In an embodiment, the portion is removed by laser ablation. In an embodiment, the portion is removed by ion beam milling.

A device of an embodiment includes a first capacitor pad comprising a superconducting material, the first capacitor pad configured to couple to a first end of a logic circuit element. In an embodiment, the device includes a second capacitor pad comprising a second superconducting material, the capacitor pad configured to couple to a second end of the logic circuit element. In an embodiment, the second capacitor pad includes a first portion; a second portion; and a bridge configured to electrically connect the first portion and the second portion.

In an embodiment, the bridge is configured to be removable by masking and etching. In an embodiment, the bridge is configured to be removable by laser ablation. In an embodiment, the bridge is configured to be removable by ion beam milling.

In an embodiment, the first capacitor pad further includes a first portion; a second portion; and a bridge configured to electrically connect the first portion and the second portion. In an embodiment, the first capacitor pad and the second capacitor pad are symmetric.

In an embodiment, the first capacitor pad and the second capacitor pad are asymmetric. In an embodiment, the first capacitor pad further includes a plurality of portions; and a plurality of bridges configured to electrically connect adjacent portions of the plurality of portions. In an embodiment, the plurality of portions are asymmetric.

In an embodiment, a superconductor fabrication system includes a lithography component, the superconductor fabrication system when operated to fabricate a superconducting device performing operations including: forming a capacitor pad for a nonlinear resonator; comparing a resonance frequency of the nonlinear resonator to a target frequency to determine whether the resonance frequency falls within a range of the target frequency; and removing, responsive to the resonance frequency failing to fall within the range, a portion of the capacitor pad.

An embodiment includes a fabrication method for fabricating the superconducting device.

An embodiment includes a fabrication system for fabricating the superconducting device.

BRIEF DESCRIPTION OF THE DRAWINGS

The novel features of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
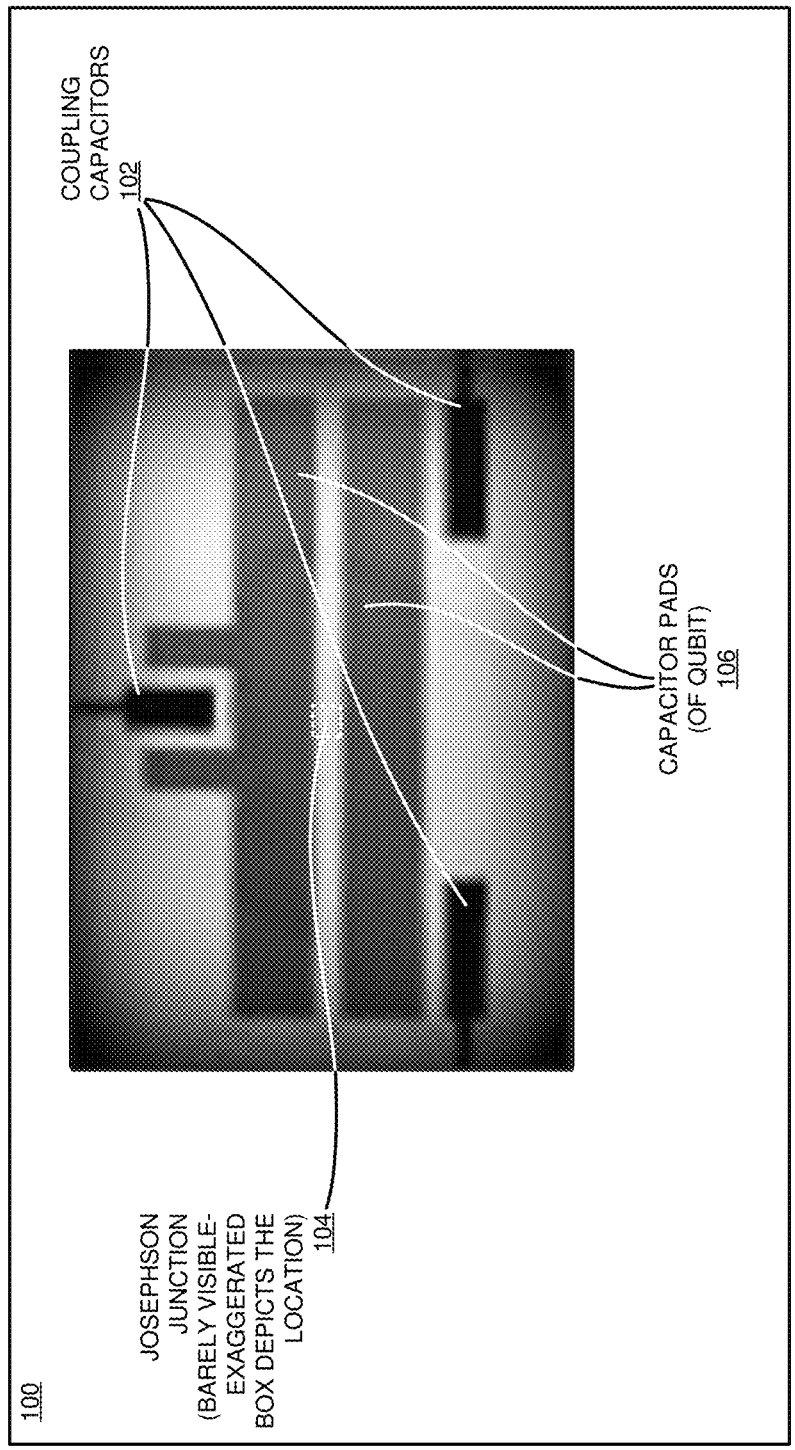
FIG. 1 depicts a scaled image of a qubit with a capacitive coupling to external circuits.

The illustrative embodiments used to describe the invention generally address and solve the above-described problem in superconducting qubit resonators of fixed-frequency qubits. The illustrative embodiments provide a fabrication method for resonant frequency adjustment of fixed-frequency qubits.

An embodiment can be implemented as a superconducting qubit resonator. A fabrication method for superconducting qubit resonators can be implemented as a software application. The application implementing an embodiment can be configured to operate in conjunction with an existing semiconductor/superconductor fabrication system—such as a lithography system.

For the clarity of the description, and without implying any limitation thereto, the illustrative embodiments are described using a simplified diagram of the example superconducting qubit resonator in the figures and the illustrative embodiments. In an actual fabrication of a superconducting qubit resonator, additional structures that are not shown or described herein, or structures different from those shown and described herein, may be present without departing the scope of the illustrative embodiments. Similarly, within the scope of the illustrative embodiments, a shown or described structure in the example superconducting qubit resonator may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

A qubit is only used as a non-limiting example superconducting quantum logic circuit in which an embodiment can be used. From this disclosure, those of ordinary skill in the art will be able to conceive many other superconducting quantum logic circuits and conventional logic circuits in which the resonance frequency adjustment of the illustrative embodiments will be usable, and the same are contemplated within the scope of the illustrative embodiments.

Figure 2:
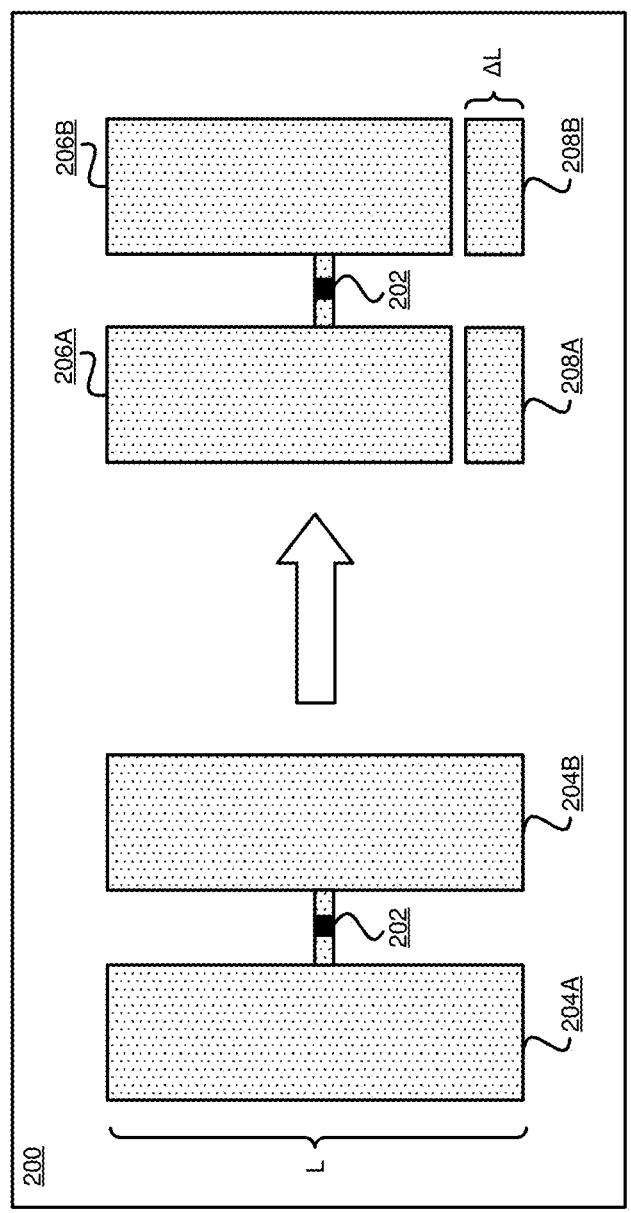
FIG. 2 depicts an example step in an example fabrication process for a fixed-frequency resonator in accordance with an illustrative embodiment.
Figure 3:
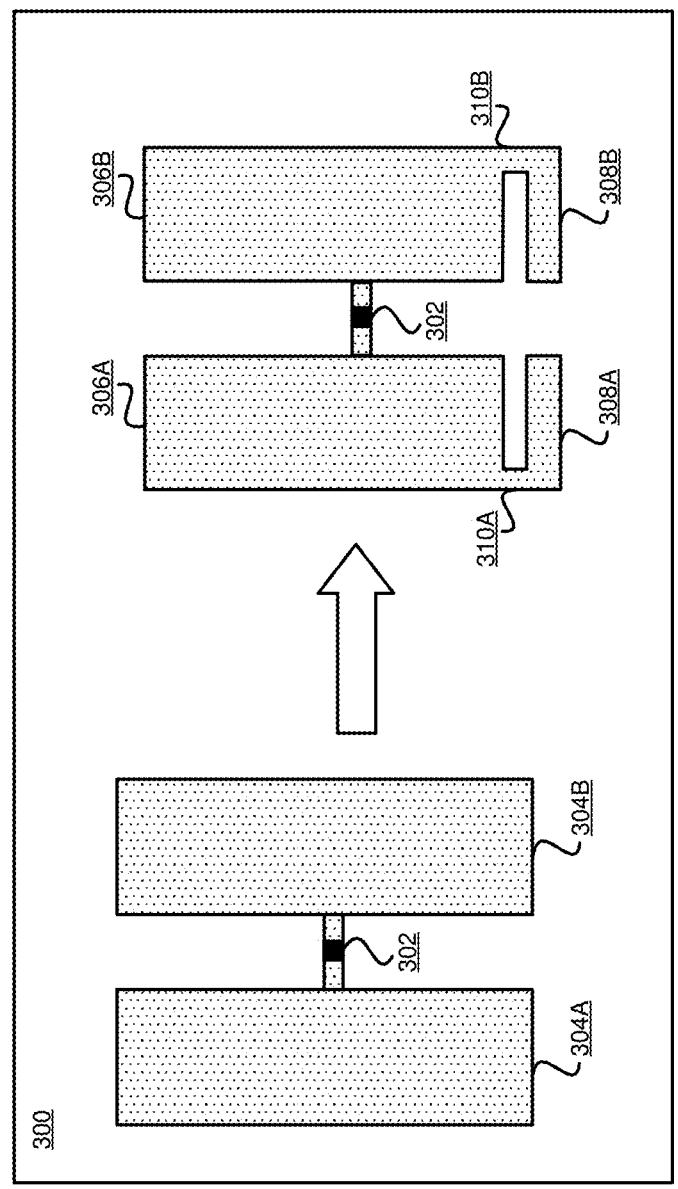
FIG. 3 depicts an example step in a second example fabrication process for fabricating a fixed-frequency resonator in accordance with an illustrative embodiment.
Figure 4:
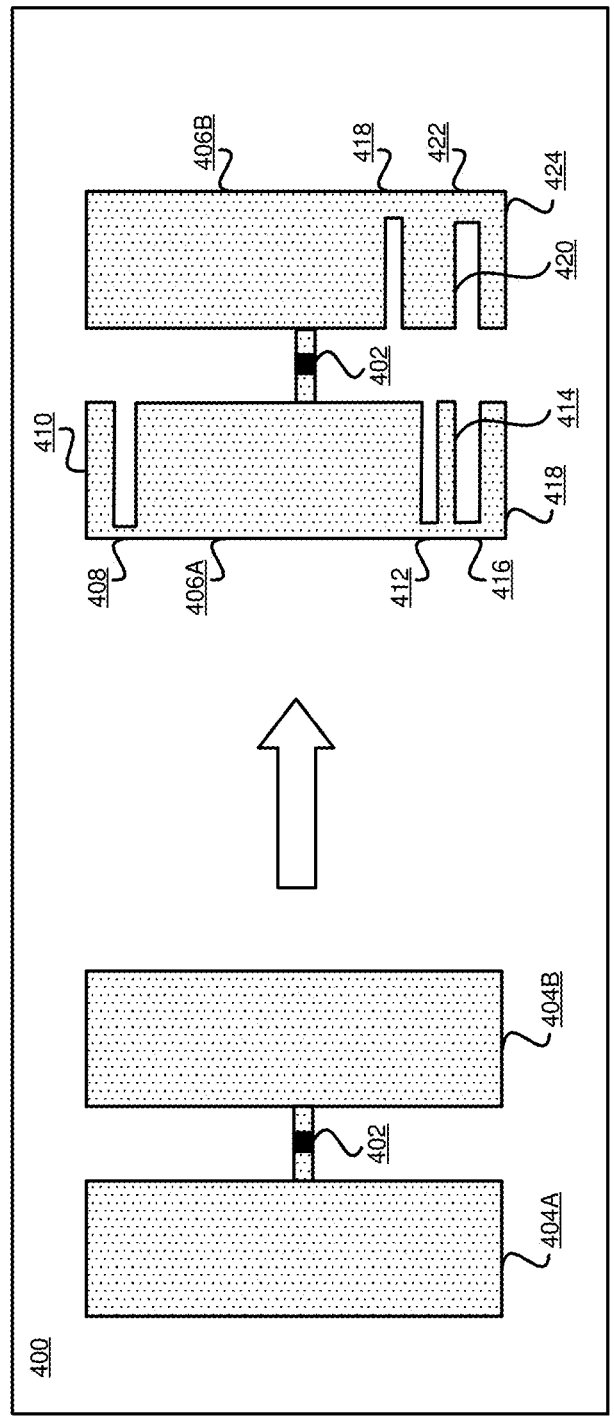
FIG. 4 depicts an example step in the second example fabrication process for fabricating a fixed-frequency resonator in accordance with an illustrative embodiment.
Figure 5:
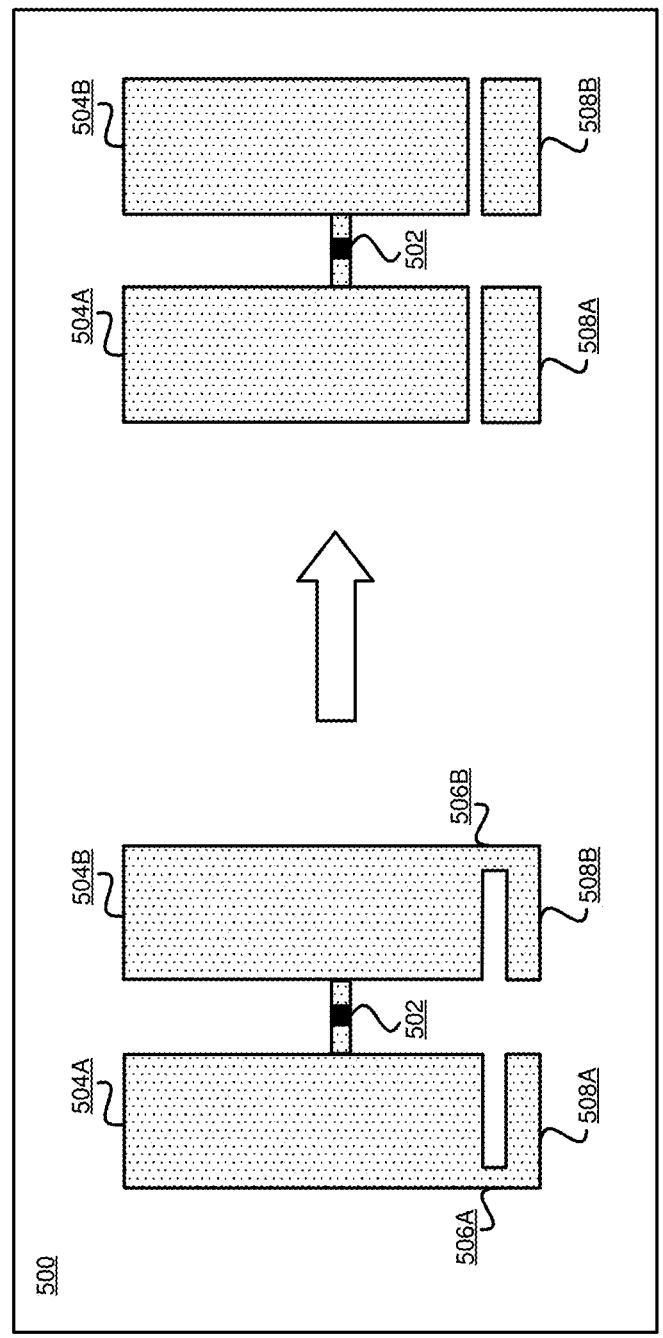
FIG. 5 depicts an example step in the second example fabrication process for fabricating a fixed-frequency resonator in accordance with an illustrative embodiment.

FIG. 2 depicts one example step of one example fabrication process for fabricating a fixed-frequency resonator. FIGS. 3-5 depict various example steps of a second example fabrication process for fabricating a fixed-frequency resonator. The fixed-frequency resonators formed by the two example processes are structurally different as described below but are functionally equivalent to be interchangeably usable instead of capacitor pads 106 in FIG. 1.

With reference to FIG. 2, this figure depicts an example step in an example fabrication process for a fixed-frequency resonator in accordance with an illustrative embodiment. Capacitor pads 204A, 204B represent capacitive devices fabricated in a manner described herein, e.g., usable in place of capacitor pads 106 in FIG. 1.

Capacitor pads 204A, 204B drive Josephson junction 202 and form a nonlinear resonator. In an embodiment, capacitor pads 204A, 204B comprise a material that exhibits superconductivity in a portion of the cryogenic temperature range, between 70 to 0.01K, inclusive of both ends of the range. As a non-limiting example, the superconducting material of capacitor pads 204A, 204B can be Niobium. In an embodiment, a fabrication system sputters superconducting material onto a substrate to form capacitor pads 204A, 204B. In an embodiment, capacitor pads 204A, 204B have a length, L.

In an embodiment, each of capacitor pads 204A, 204B have a corresponding capacitance value. The capacitance values of the capacitor pads 204A, 204B are directly proportional to the area of the corresponding capacitor pad. A fixed-frequency resonator can be modeled as a lumped element LC circuit with a total capacitance, C. Each capacitance value of the capacitor pads 204A, 204B contributes to the total capacitance, C. The resonance frequency of the fixed-frequency resonator is proportional to the resonance frequency, f, of the fixed-frequency resonator by the formula, $$f \sim \frac{1}{\sqrt{C}}.$$

In step 200, an embodiment causes a fabrication system to remove a portion of the capacitor pads 204A, 204B, thus forming first portions 206A, 206B and second portions 208A, 208B. For example, an embodiment can cause a fabrication system to remove capacitor pad material using laser ablation or ion beam milling. First portions 206A, 206B maintain an electrical connection with Josephson Junction 202 and form a modified nonlinear resonator. An embodiment causes a fabrication system to remove the second portions 208A, 208B from the capacitive devices, thus decreasing the total capacitance and increasing the resonant frequency of the fixed-frequency resonator.

In one embodiment, removal of capacitor pad material from both capacitor pads is not necessary. Reduction in the area of only one of the two pads, e.g., from pad 204A but not from 204B, is effective to change the total capacitance C, and therefore the resonance frequency f. The removal is depicted and described from both pads only for the clarity of the depictions and not as a limitation on the illustrative embodiments. Asymmetrical removal from the capacitor pads, including non-removal from one of the pads, to cause an effect described herein, is contemplated within the scope of the illustrative embodiments.

Continuing with the example depiction of FIG. 2, in an embodiment, first portion 206A and first portion 206B are symmetric. For example, first portion 206A and first portion 206B can be approximately equal in size, between 0-5 percent, inclusive of both ends of the range. In another embodiment, first portion 206A and first portion 206B are asymmetric. For example, first portion 206A and first portion 206B can differ in size, more than 5 percent up to as much as 40 percent.

In an embodiment, second portion 208A and second portion 208B are symmetric. For example, second portion 208A and second portion 208B can be approximately equal in size, between 0-5 percent, inclusive of both ends of the range. In another embodiment, second portion 208A and second portion 208B are asymmetric. For example, second portion 208A and second portion 206B can differ in size, more than 5 percent up to as much as approximately 200 percent. In another step, an embodiment causes a fabrication system to remove only a portion of capacitor pad 204A, thus forming first portion 206A and second portion 208A.

In an embodiment, a fabrication system removes a length, ΔL, of capacitor pad material from the length L of capacitor pads 204A, 204B. In another embodiment, ΔL comprises a length of a cut. For example, a fabrication system can remove a length of capacitor pad material between 1-5 micrometers, inclusive of both ends of the range. In an embodiment, ΔL comprises a length of the cut and a length of the corresponding second portion.

In another embodiment, fabrication system removes a portion of capacitor pad 204A at a first end of the fixed-frequency resonator and a portion of capacitor pad 204B at an opposite end of the fixed-frequency resonator. In another embodiment, fabrication system removes a portion of capacitor pad 204A at an oblique angle to the length, L, of capacitor pad 204A. Step 200 can be repeated to remove additional capacitor pad material and reach a desired resonance frequency for the fixed-frequency resonator.

These examples of capacitor pad material, deposition methods, and material removal methods are not intended to be limiting. From this disclosure those of ordinary skill in the art will be able to conceive of many other materials and methods suitable for forming and removing portions of the capacitor pad and the same are contemplated within the scope of the illustrative embodiments.

With reference to FIG. 3, this figure depicts an example step in a second example fabrication process for fabricating a fixed-frequency resonator in accordance with an illustrative embodiment. Capacitor pads 304A, 304B represent capacitive devices fabricated in a manner described herein, e.g., usable in place of capacitor pads 106 in FIG. 1.

Capacitor pads 304A, 304B drive Josephson junction 302 and form a nonlinear resonator. In an embodiment, capacitor pads 304A, 304B comprise a material that exhibits superconductivity in a portion of the cryogenic temperature range. For example, the superconducting material of capacitor pads 304A, 304B can be Niobium.

In step 300, an embodiment causes a fabrication system to remove a segment of capacitor pads 304A, 304B, thus forming first portions 306A, 306B; second portions 308A, 308B; and bridges 310A, 310B. For example, an embodiment can cause a fabrication system to mask and etch the capacitor pads to remove a segment of the corresponding capacitor pad. In step 300, an embodiment causes a fabrication system to form a corresponding gap between first portions 306A, 306B and second portions 308A, 308B.

Bridges 310A, 310B electrically connect second portions 308A, 308B with first portions 306A, 306B. For example, second portions 308A, 308B and bridges 310A, 310B contribute to a capacitance value of the corresponding capacitor pads. First portions 306A, 306B; second portions 308A, 308B; and bridges 310A, 310B maintain an electrical connection with Josephson Junction 302 and form a modified nonlinear resonator.

In an embodiment, first portion 306A and first portion 306B are symmetric. For example, first portion 306A and first portion 306B can be approximately equal in size, between 0-5 percent, inclusive of both ends of the range. In another embodiment, first portion 306A and first portion 306B are asymmetric. For example, first portion 306A and first portion 306B can differ in size, more than 5 percent up to as much as 40 percent.

In an embodiment, second portion 308A and second portion 308B are symmetric. For example, second portion 308A and second portion 308B can be approximately equal in size, between 0-5 percent, inclusive of both ends of the range. In another embodiment, second portion 308A and second portion 308B are asymmetric. For example, second portion 308A and second portion 308B can differ in size, more than 5 percent up to as much as approximately 200 percent. In another step, an embodiment causes a fabrication system to remove only a portion of capacitor pad 304A, thus forming first portion 306A and second portion 308A.

In an embodiment, a fabrication system removes a length of capacitor pad material from capacitor pads 304A, 304B. In another embodiment, the removed material comprises a length of a cut. For example, a fabrication system can remove a length of capacitor pad material between 1-5 micrometers, inclusive of both ends of the range. In an embodiment, the removed material comprises a length of the cut and a length of the corresponding second portion.

In another embodiment, fabrication system removes a portion of capacitor pad 304A at a first end of the fixed-frequency resonator and a portion of capacitor pad 304B at an opposite end of the fixed-frequency resonator. In another embodiment, fabrication system removes a portion of capacitor pad 304A at an oblique angle to a length of capacitor pad 304A.

These examples of capacitor pad material, deposition methods, and material removal methods are not intended to be limiting. From this disclosure those of ordinary skill in the art will be able to conceive of many other materials and methods suitable for forming and removing portions of the capacitor pad and the same are contemplated within the scope of the illustrative embodiments.

With reference to FIG. 4, this figure depicts an example step in the second example fabrication process for fabricating a fixed-frequency resonator in accordance with an illustrative embodiment. Capacitor pads 404A, 404B represent capacitive devices fabricated in a manner described herein, e.g., usable in place of capacitor pads 106 in FIG. 1.

Capacitor pads 404A, 404B drive Josephson junction 402 and form a nonlinear resonator. In an embodiment, capacitor pads 404A, 404B comprise a material that exhibits superconductivity in a portion of the cryogenic temperature range. For example, the superconducting material of capacitor pads 404A, 404B can be Niobium.

In step 400, an embodiment causes a fabrication system to remove a plurality of segments of capacitor pads 404A, 404B, thus forming first portions 406A, 406B; second portion 410, third portion 414, fourth portion 418, fifth portion 422, sixth portion 426, and bridges 408, 412, 416, 420, 424. For example, an embodiment can cause a fabrication system to mask and etch the capacitor pads to remove a plurality of segments of the corresponding capacitor pad. In step 400, an embodiment causes a fabrication system to form a corresponding gap between first portion 406A and portions 410, 414, 418 and to form a corresponding gap between first portion 406B and portions 422, 426.

Bridges 408, 412, 416 electrically connect portions 410, 414, 418 with first portion 406A. For example, portions 410, 414, 418 and bridges 408, 412, 416 contribute to a capacitance value of the corresponding capacitor pad. Bridges 420, 424 electrically connect portions 422, 426 with first portion 406B. For example, portions 422, 426 and bridges 420, 424 contribute to a capacitance value of the corresponding capacitor pad. Portions 406A, 406B, 410, 414, 418, 422, 426 and bridges 408, 412, 416, 420, 424 maintain an electrical connection with Josephson Junction 402 and form a modified nonlinear resonator.

In an embodiment, first portion 406A and first portion 406B are symmetric. For example, first portion 406A and first portion 406B can be approximately equal in size, between 0-5 percent, inclusive of both ends of the range. In another embodiment, first portion 406A and first portion 406B are asymmetric. For example, first portion 406A and first portion 406B can differ in size, more than 5 percent up to as much as 40 percent.

In an embodiment, at least two of portions 410, 414, 418, 422, 426 are symmetric. For example, at least two of portions 410, 414, 418, 422 can be approximately equal in size, between 0-5 percent, inclusive of both ends of the range. In another embodiment, at least two of portions 410, 414, 418, 422, 426 are asymmetric. For example, at least two of portions 410, 414, 418, 422, 426 can differ in size, more than 5 percent up to as much as approximately 200 percent.

These examples of capacitor pad material, deposition methods, and material removal methods are not intended to be limiting. From this disclosure those of ordinary skill in the art will be able to conceive of many other materials and methods suitable for forming and removing portions of the capacitor pad and the same are contemplated within the scope of the illustrative embodiments.

With reference to FIG. 5, this figure depicts an example step in the second example fabrication process for fabricating a fixed-frequency resonator in accordance with an illustrative embodiment. Fabrication continues on the modified fixed-frequency resonator in FIG. 3.

In step 500, an embodiment causes a fabrication system to remove bridges 506A, 506B, thus separating first portions 504A, 504B and second portions 508A, 508B. For example, an embodiment can cause a fabrication system to remove capacitor pad material using laser ablation or ion beam milling. First portions 504A, 504B maintain an electrical connection with Josephson Junction 502 and form a further modified nonlinear resonator. An embodiment causes a fabrication system to remove the second portions 508A, 508B and bridges 506A, 506B from the capacitive devices, thus decreasing the total capacitance and increasing the resonant frequency of the fixed-frequency resonator. Step 500 can be repeated to remove additional capacitor pad material and reach a desired resonance frequency for the fixed-frequency resonator. For example, a fabrication system can remove additional bridges as in the modified nonlinear resonator in FIG. 4.

Figure 6:
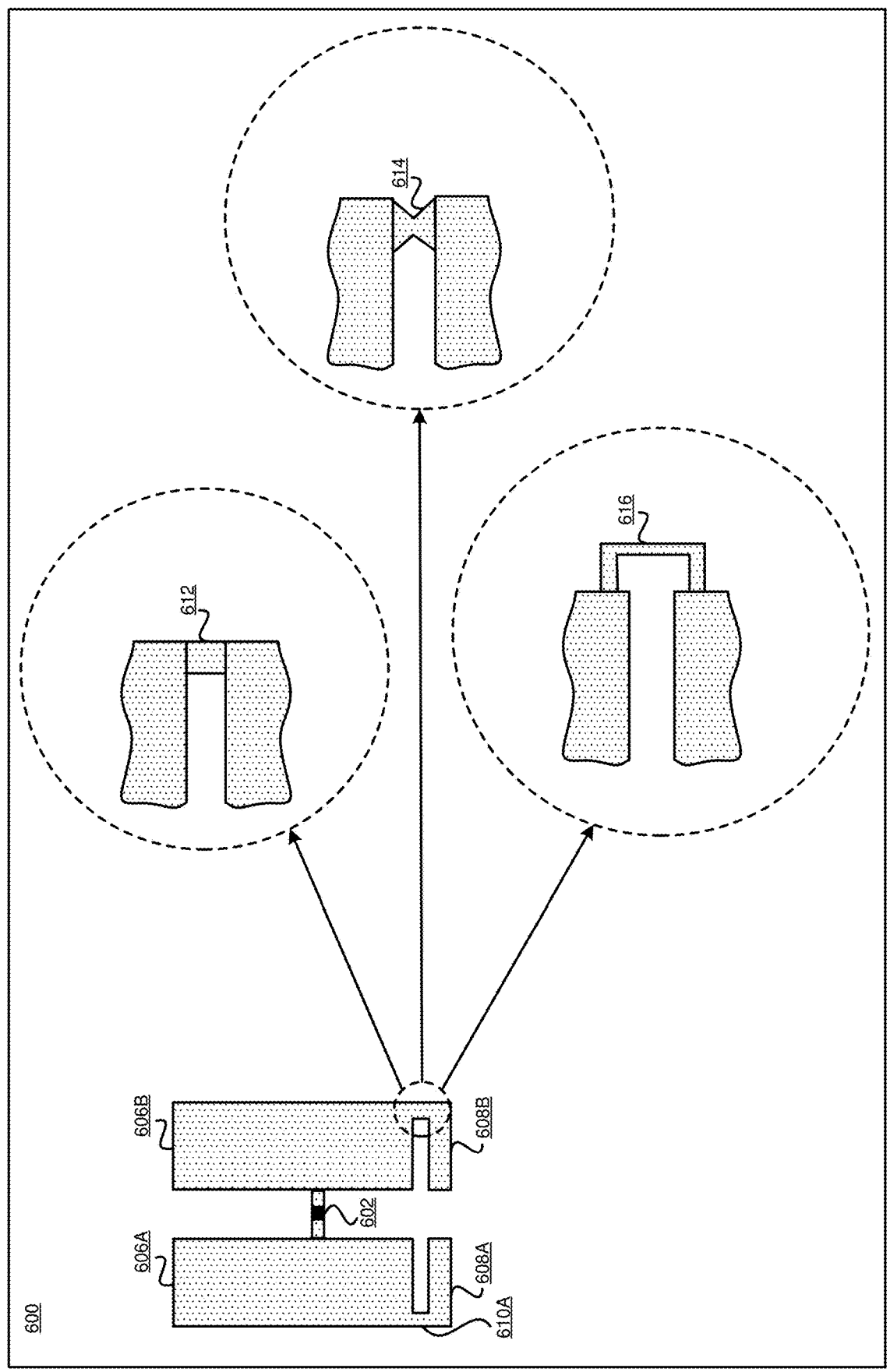
FIG. 6 depicts a configuration of a fixed-frequency resonator in accordance with an illustrative embodiment.

With reference to FIG. 6, this figure depicts a configuration of a fixed-frequency resonator in accordance with an illustrative embodiment. Configuration 600 is an example fixed-frequency resonator similar to modified nonlinear resonator in FIG. 3.

Configuration 600 comprises Josephson Junction 602, first portions 606A, 606B; second portions 608A, 608B; and bridge 610. Bridges 612, 614, 616 are example bridges formed in step 300 in FIG. 3.

Figure 7:
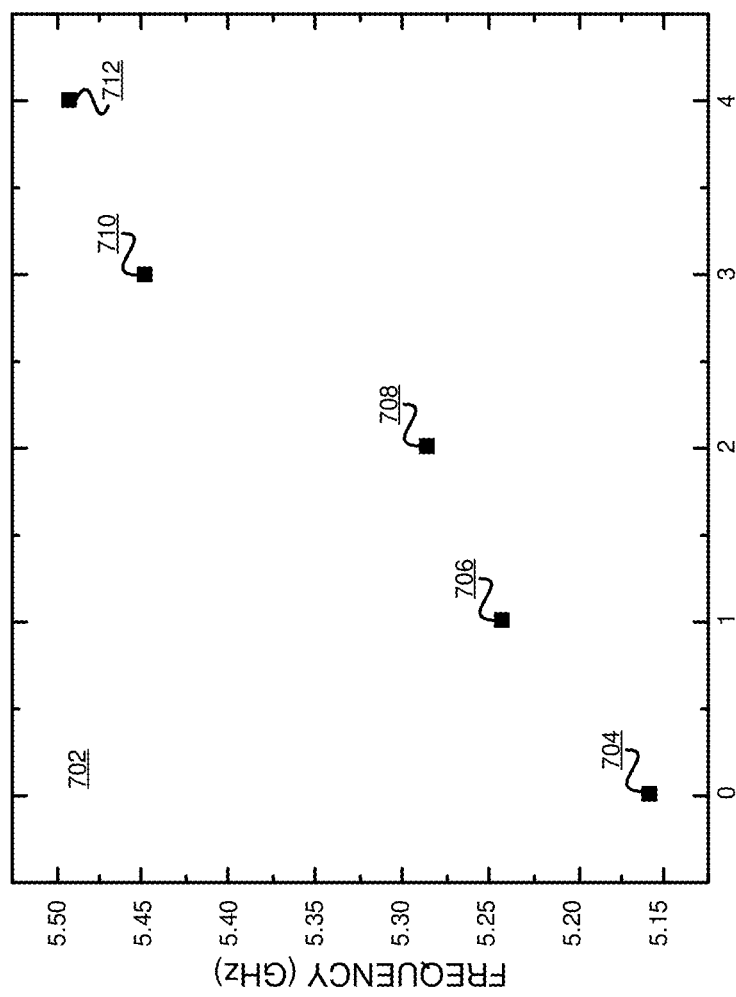
FIG. 7 depicts results of a simulation to determine the resonance frequency for a fixed-frequency resonator example.

With reference to FIG. 7, this figure depicts results of a simulation to determine the resonance frequency for a fixed-frequency resonator example. The fixed-frequency resonator, whose resonance frequency results are shown in FIG. 6, is based on the modified nonlinear resonator having a plurality of bridges depicted in FIG. 4. Specifically, in the non-limiting example implementation, the original capacitor pad sizes were 500 micrometers in length and 120 micrometers wide, the first two segments were 35 micrometers in length, the second two segments were 40 micrometers in length, the gaps between the respective segments and the central portion of the capacitor pads were 5 micrometers in length and the bridges which connect the respective segments with the central portion of the capacitor pads across the gap were each 5 micrometers in length and 5 micrometers in wide. The removal process for each bridge separated the respective segment from the central portion of the capacitor pads.

Data point 704 corresponds to the resonance frequency of the modified nonlinear resonator with no bridges removed. Data point 706 corresponds to the resonance frequency of the modified nonlinear resonator with one bridge removed. Data point 708 corresponds to the resonance frequency of the modified nonlinear resonator with two bridges removed. Data point 710 corresponds to the resonance frequency of the modified nonlinear resonator with three bridges removed. Data point 712 corresponds to the resonance frequency of the modified nonlinear resonator with four bridges removed. As can be seen, the resonance frequency of the modified nonlinear resonator increases with the removal of each bridge.

Figure 8:
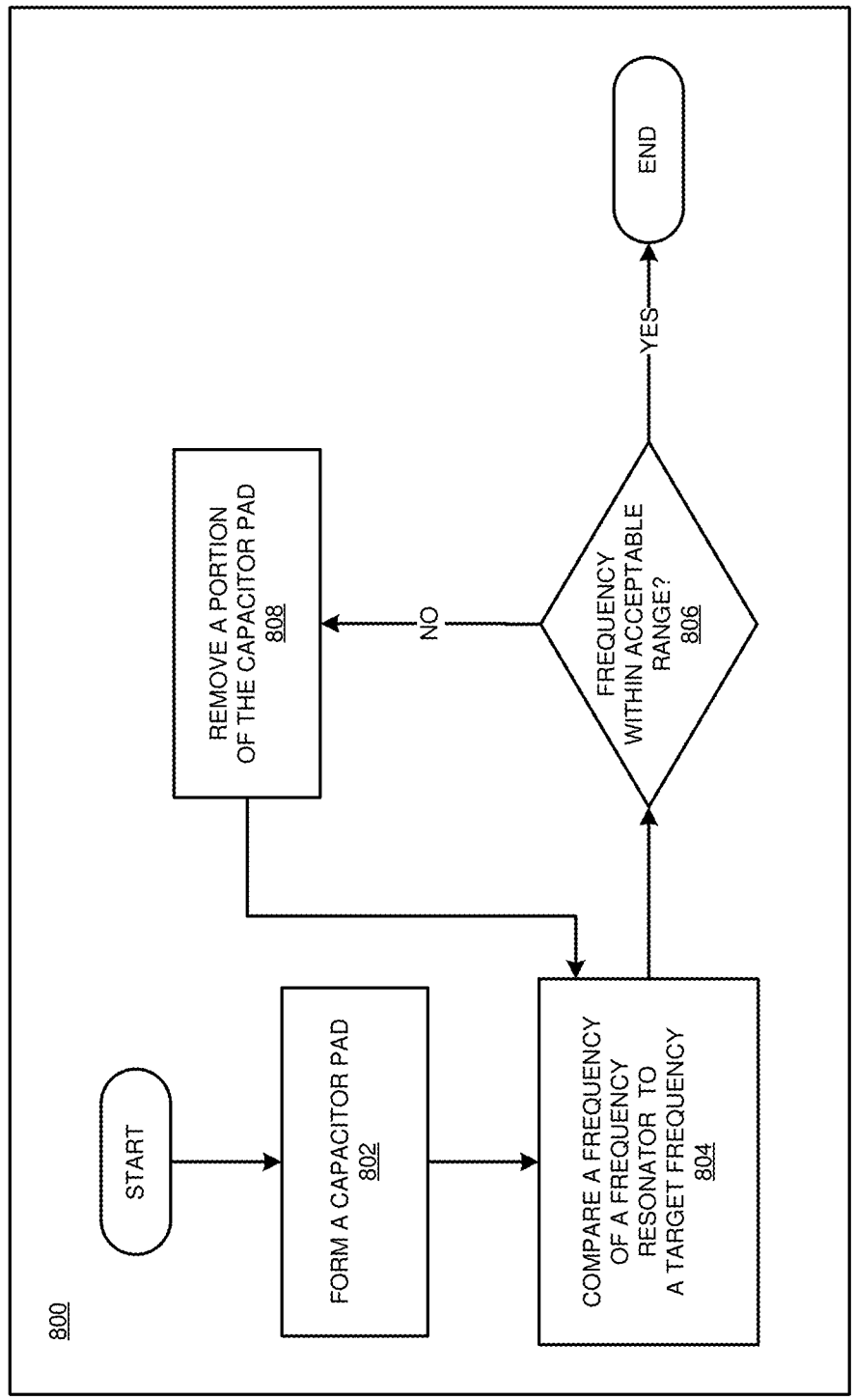
FIG. 8 depicts a flowchart of an example fabrication process for fabricating a fixed-frequency resonator in accordance with an illustrative embodiment.

With reference to FIG. 8, this figure depicts a flowchart of an example fabrication process for fabricating a fixed-frequency resonator in accordance with an illustrative embodiment. Process 800 can be configured to operate in conjunction with an existing semiconductor/superconductor fabrication system—such as a lithography system.

In an embodiment, a fabrication system forms a capacitor pad (block 802). In an embodiment, a frequency resonator comprises the capacitor pad. In an embodiment, a fabrication system compares a resonance frequency of the frequency resonator (qubit) to a target frequency (block 804). In an embodiment, the fabrication system determines the resonance frequency is within an acceptable range of the target frequency (block 806). For example, the fabrication system can determine the resonance frequency is within half of one percent of the target frequency. In an embodiment, the fabrication system determines the resonance frequency falls outside an acceptable range of the target frequency. For example, the fabrication system can determine the resonance frequency differs by greater than one half of one percent from the target frequency. If the fabrication system determines the resonance frequency falls outside the acceptable range (NO path of block 806) the fabrication system removes a portion of the capacitor pad (block 808). Process 800 then returns to block 804 to continue. If the fabrication system determines the resonance frequency is within an acceptable range (YES path of block 806), process 800 ends.

Figure 9:
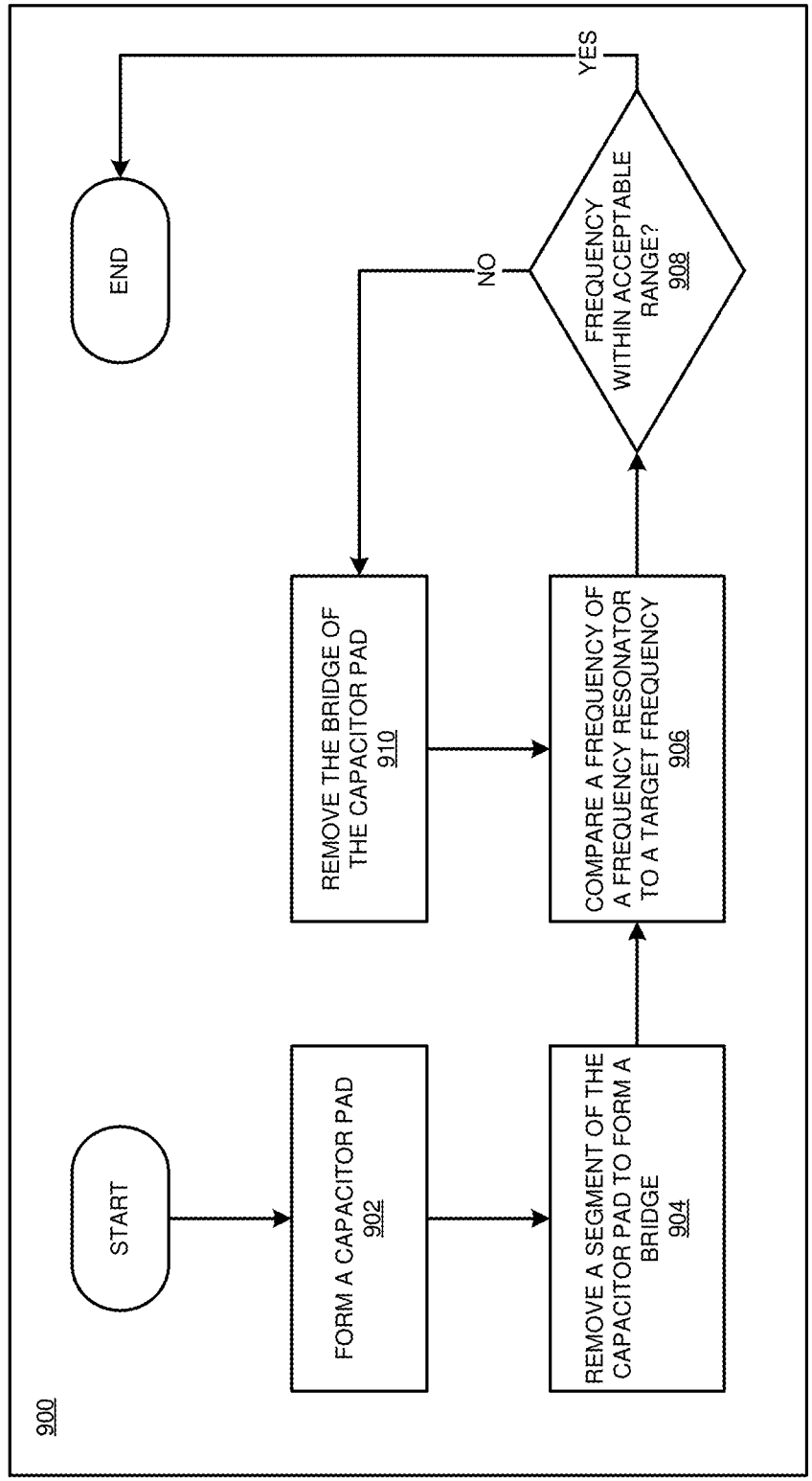
FIG. 9 depicts a flowchart of a second example fabrication process for fabricating a fixed-frequency resonator in accordance with an illustrative embodiment.

With reference to FIG. 9, this figure depicts a flowchart of a second example fabrication process for fabricating a fixed-frequency resonator in accordance with an illustrative embodiment. Process 900 can be configured to operate in conjunction with an existing semiconductor/superconductor fabrication system—such as a lithography system.

In an embodiment, a fabrication system forms a capacitor pad (block 902). In an embodiment, a frequency resonator comprises the capacitor pad. In an embodiment, a fabrication system removes a segment of the capacitor pad to form a bridge (block 904). For example, a fabrication system can remove a segment of the capacitor pad to form a first portion and second portion having a gap therebetween. In an embodiment, the bridge electrically connects the first portion and the second portion. In an embodiment, a fabrication system compares a resonance frequency of the frequency resonator (qubit) to a target frequency (block 906). In an embodiment, the fabrication system determines the resonance frequency is within an acceptable range of the target frequency (block 908). For example, the fabrication system can determine the resonance frequency is within half of one percent of the target frequency. In an embodiment, the fabrication system determines the resonance frequency falls outside an acceptable range of the target frequency. For example, the fabrication system can determine the resonance frequency differs by greater than one half of one percent from the target frequency. If the fabrication system determines the resonance frequency falls outside the acceptable range (NO path of block 908) the fabrication system removes the bridge of the capacitor pad (block 910). Process 900 then returns to block 906 to continue. If the fabrication system determines the resonance frequency is within an acceptable range (YES path of block 908), process 900 ends.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A device comprising:
 a first capacitor pad comprising a superconducting material; and
 a second capacitor pad comprising a second superconducting material, the second capacitor pad comprising:
 a first portion;
 a second portion; and
 a bridge configured to electrically connect the first portion and the second portion.

2. The device of claim 1, wherein the bridge is removable by masking and etching.

3. The device of claim 1, wherein the bridge is removable by laser ablation.

4. The device of claim 1, wherein the bridge is removable by ion beam milling.

5. The device of claim 2, the first capacitor pad further comprising:
 a first portion;
 a second portion; and
 a bridge configured to electrically connect the first portion and the second portion.

6. The device of claim 5, wherein the first capacitor pad is approximately equal in size to the second capacitor pad.

7. The device of claim 5, wherein the first capacitor pad and the second capacitor pad are different in size.

8. The device of claim 1, the first capacitor pad further comprising:
 a plurality of portions; and
 a plurality of bridges configured to electrically connect adjacent portions of the plurality of portions.

9. The device of claim 8, wherein the plurality of portions are different in size.

* * * * *